(12) United States Patent
Zhu et al.

(10) Patent No.: US 10,886,155 B2
(45) Date of Patent: Jan. 5, 2021

(54) OPTICAL STACK DEPOSITION AND ON-BOARD METROLOGY

(71) Applicant: Applied Materials, Inc., Santa Clara, CA (US)

(72) Inventors: Mingwei Zhu, San Jose, CA (US); Zihao Yang, Santa Clara, CA (US); Nag B. Patibandla, Pleasanton, CA (US); Daniel Lee Diehl, Chiba (JP); Yong Cao, San Jose, CA (US); Weimin Zeng, San Jose, CA (US); Renjing Zheng, San Jose, CA (US); Edward Budiarto, Fremont, CA (US); Surender Kumar Gurusamy, Santa Clara, CA (US); Todd Egan, Fremont, CA (US); Niranjan R. Khasgiwale, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 11 days.

(21) Appl. No.: 16/249,653

(22) Filed: Jan. 16, 2019

(65) Prior Publication Data
US 2020/0227294 A1 Jul. 16, 2020

(51) Int. Cl.
*H01L 21/67* (2006.01)
*H01L 21/687* (2006.01)
*G01N 21/21* (2006.01)

(52) U.S. Cl.
CPC ...... *H01L 21/67253* (2013.01); *G01N 21/211* (2013.01); *H01L 21/68771* (2013.01)

(58) Field of Classification Search
CPC .............................................. H01L 21/67184

USPC .......................................................... 700/121
See application file for complete search history.

(56) References Cited

U.S. PATENT DOCUMENTS

| 6,642,066 B1 | 11/2003 | Halliyal et al. |
| 6,699,380 B1 * | 3/2004 | Chen ............... C23C 18/1632 |
| | | 204/198 |
| 6,829,056 B1 | 12/2004 | Barnes et al. |

(Continued)

FOREIGN PATENT DOCUMENTS

| KR | 10-2018-0075702 A | 7/2018 |
| WO | 2017091331 A1 | 6/2017 |

OTHER PUBLICATIONS

International Search Report and the Written Opinion for International Application No. PCT/US2019/058712 dated Feb. 17, 2020, 16 pages.

*Primary Examiner* — Suresh Suryawanshi
(74) *Attorney, Agent, or Firm* — Patterson & Sheridan, LLP; Steven H. Versteeg (57) ABSTRACT

A method and apparatus for forming an optical stack having uniform and accurate layers is provided. A processing tool used to form the optical stack comprises, within an enclosed environment, a first transfer chamber, an on-board metrology unit, and a second transfer chamber. A first plurality of processing chambers is coupled to the first transfer chamber or the second transfer chamber. The on-board metrology unit is disposed between the first transfer chamber and the second transfer chamber. The on-board metrology unit is configured to measure one or more optical properties of the individual layers of the optical stack without exposing the layers to an ambient environment.

20 Claims, 4 Drawing Sheets

(56) References Cited

U.S. PATENT DOCUMENTS

| | | | |
|---|---|---|---|
| 8,808,059 B1* | 8/2014 | David | G01B 11/0625 451/5 |
| 2002/0005168 A1* | 1/2002 | Kraus | H01L 21/67196 118/715 |
| 2003/0015493 A1 | 1/2003 | Grasshoff et al. | |
| 2003/0030822 A1* | 2/2003 | Finarov | G01B 11/00 356/636 |
| 2006/0245847 A1* | 11/2006 | Haris | H01L 21/67184 414/217 |
| 2006/0246683 A1 | 11/2006 | Pan et al. | |
| 2007/0012337 A1* | 1/2007 | Hillman | B08B 7/0021 134/1.3 |
| 2007/0134821 A1* | 6/2007 | Thakur | C23C 16/45593 438/5 |
| 2007/0196011 A1* | 8/2007 | Cox | H01L 21/67109 382/145 |
| 2007/0292244 A1* | 12/2007 | Moore | H01L 21/67742 414/217 |
| 2008/0232934 A1* | 9/2008 | Price | H01L 21/67196 414/217 |
| 2010/0227046 A1 | 9/2010 | Kato et al. | |
| 2012/0096006 A1* | 4/2012 | David | H01L 22/26 707/741 |
| 2012/0268738 A1* | 10/2012 | David | B24B 49/12 356/326 |
| 2012/0274932 A1* | 11/2012 | David | G01B 11/0683 356/300 |
| 2012/0276815 A1* | 11/2012 | David | G01N 21/84 451/5 |
| 2012/0278028 A1* | 11/2012 | David | B24B 49/12 702/127 |
| 2013/0084655 A1* | 4/2013 | Yue | G03F 7/70633 438/7 |
| 2013/0343841 A1 | 12/2013 | van der Meulen | |
| 2014/0154887 A1* | 6/2014 | Trivedi | H01L 21/3086 438/703 |
| 2014/0242880 A1* | 8/2014 | David | B24B 49/12 451/5 |
| 2014/0242881 A1* | 8/2014 | David | B24B 49/12 451/5 |
| 2015/0369640 A1* | 12/2015 | Schulze | H01L 21/67253 702/183 |
| 2016/0118280 A1 | 4/2016 | Wood et al. | |
| 2016/0315000 A1 | 10/2016 | Nguyen et al. | |
| 2017/0148654 A1* | 5/2017 | Paul | H01L 21/68707 |
| 2018/0061691 A1 | 3/2018 | Jain et al. | |
| 2020/0083080 A1* | 3/2020 | Clark | H01L 21/02271 |

* cited by examiner

OPTICAL STACK DEPOSITION AND ON-BOARD METROLOGY

BACKGROUND

Field

Embodiments of the present disclosure generally relate to depositing and measuring layers of optical stacks in a processing tool.

Description of the Related Art

A processing tool may include various deposition chambers used to deposit materials, such as dielectric layers or films on substrates, in order to form optical stacks. When forming optical stacks, the films are generally deposited as uniformly and accurately as possible. To determine if a film has been deposited uniformly and accurately, the stack is removed from the deposition chamber to be measured using external metrology. However, utilizing an external metrology assembly exposes the films to air, causing the properties of the films to undesirably change. The properties of the films changing may result in various errors or defects, such as causing the surface or interface of the film to deteriorate or be uneven. Furthermore, removing the stack from the processing tool environment to measure the films can be time consuming, which reduces the production time and decreases throughput.

Therefore, there is a need for an apparatus and procedure for reliable, accurate, and precise metrology integrated within the processing tool to form optical stacks having uniform layers and to minimize errors or defects within the optical stack layers.

SUMMARY

A method and apparatus for forming an optical stack having uniform and accurate layers is provided. A processing tool used to form the optical stack comprises, within an enclosed environment, a first transfer chamber, an on-board metrology unit, and a second transfer chamber. A first plurality of processing chambers is coupled to the first transfer chamber or the second transfer chamber. The on-board metrology unit is disposed between the first transfer chamber and the second transfer chamber. The on-board metrology unit is configured to measure one or more optical properties of the individual layers of the optical stack without exposing the layers to an ambient environment.

In one embodiment, a processing tool comprises, a first transfer chamber, a second transfer chamber coupled to the first transfer chamber, one or more processing chambers coupled to the first transfer chamber or the second transfer chamber, and an on-board metrology unit disposed between the first transfer chamber and the second transfer chamber. The first transfer chamber, the second transfer chamber, and the on-board metrology unit are disposed in an enclosed environment.

In another embodiment, a method of forming an optical stack comprises depositing a first layer on a substrate in a first processing chamber, measuring one or more properties of the first layer using an on-board metrology unit, determining one or more errors of the first layer for correction in subsequent layers, and depositing a second layer on the first layer in a second processing chamber. The method further comprises measuring one or more properties of the second layer using the on-board metrology unit. The first processing chamber, the second processing chamber, and the on-board metrology unit are disposed in enclosed environment.

In yet another embodiment, a processing tool comprises a factory interface coupled to one or more front opening unified pods and a first transfer chamber coupled to the factory interface. The first transfer chamber comprises a first set of robotic arms. The processing tool further comprises a second transfer chamber coupled to the first transfer chamber. The second transfer chamber comprises a second set of robotic arms. The processing tool further comprises a plurality of chambers coupled to the first transfer chamber or the second transfer chamber. The plurality of chambers comprises a first plurality of processing chambers and a plurality of support chambers. The processing tool further comprises an on-board metrology unit disposed between the first transfer chamber and the second transfer chamber. The first transfer chamber, the second transfer chamber, and the on-board metrology unit are disposed in a vacuum environment.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

A method and apparatus for forming an optical stack having uniform and accurate layers is provided. A processing tool used to form the optical stack comprises, within an enclosed environment, a first transfer chamber, an on-board metrology unit, and a second transfer chamber. A first plurality of processing chambers is coupled to the first transfer chamber or the second transfer chamber. The on-board metrology unit is disposed between the first transfer chamber and the second transfer chamber. The on-board metrology unit is configured to measure one or more optical properties of the individual layers of the optical stack without exposing the layers to an ambient environment.

Figure 1:
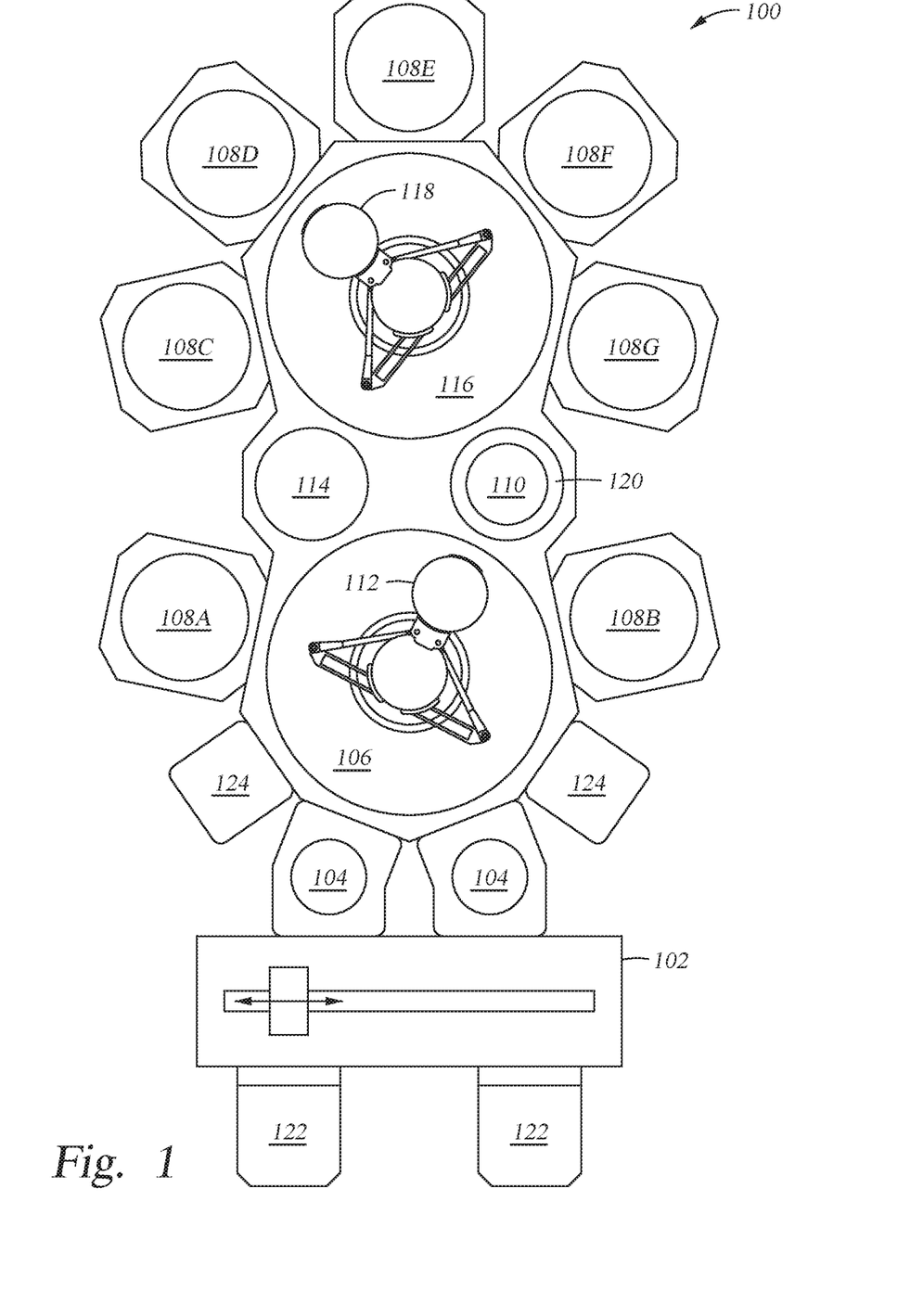
FIG. 1 illustrates a processing tool used to form an optical stack, according to one embodiment.

FIG. 1 illustrates a top view of an exemplary processing tool 100 used to form an optical stack according to implementations of the present disclosure.

The processing tool 100 generally includes a factory interface 102 adapted to receive from a front opening unified pod ("FOUP") 122 one or more cassettes of substrates (e.g., 300 mm diameter wafers) which are to be processed. The FOUP 122 has one or more substrate carriers configured to temporarily and portably store the substrates. The factory interface 102 may comprise various components not shown, such as an atmospheric robot, one or more load ports, a holding station, a lock load chamber, and/or a batch curing chamber, among others. The factory interface 102 provides a transition between the ambient environment of the factory and the internal enclosed environment of the processing tool 100 comprising a plurality of processing chambers 108A-108G. The internal enclosed environment of the processing tool 100 may be a vacuum environment or a pressurized environment. The internal enclosed environment of the processing tool 100 is separated from the surrounding ambient environment, including air.

The factory interface 102 is coupled to one or more buffers 104 that are configured to support processed and unprocessed substrates as the substrates are transferred to and from the factory interface 102. Once one or more unprocessed substrates are placed on a buffer 104, a first set of robotic arms 112 is configured to transport the substrates to a first transfer chamber 106. The first set of robotic arms 112 may comprise one or more arms. The first transfer chamber 106 may be coupled to one or more processing chambers 108A-108B. The first transfer chamber 106 is further coupled to one or more support chambers 124. The one or more support chambers 124 may include a degassing chamber, a storage chamber, a buffer chamber, a heating and/or cooling chamber(s), among others. The first set of robotic arms 112 is configured to transport substrates from the first transfer chamber 106 to and from the one or more processing chambers 108A-108B and support chambers 124.

The first set of robotic arms 112 is further configured to transport substrates from the first transfer chamber 106 to an on-board metrology (OBM) unit 110 mounted on top of or underneath a first cooling chamber 120. A second cooling chamber 114 is disposed adjacent to the first cooling chamber 120 disposed above or beneath the OBM unit 110. The OBM unit 110, the first cooling chamber 120, and the second cooling chamber 114 are disposed between the first transfer chamber 106 and a second transfer chamber 116. The OBM 110, the first cooling chamber 120, and the second cooling chamber 114 may be disposed in a pass through chamber connecting the first transfer chamber 106 to the second transfer chamber 116. The first transfer chamber 106, the second transfer chamber 116, the first cooling chamber 120, and the second cooling chamber 114 are a uniform body. In one embodiment, the OBM unit 110 is disposed in a separate chamber coupled to either the first or second transfer chambers 106, 116, such as replacing a support chamber 124 or a processing chamber 108C.

The second transfer chamber 116 comprises a second set of robotic arms 118. The second set of robotic arms 118 may comprise one or more arms. The second set of robotic arms 118 is configured to transport substrates to and from the first cooling chamber 120 and/or the second cooling chamber 114 to the second transfer chamber 116. The second set of robotic arms 118 is further configured to transport substrates from the second transfer chamber 116 to and from one or more processing chambers 108C-108G coupled to the second transfer chamber 116. One or more of the one or more processing chambers 108A-10G may be coupled to only one of the first transfer chamber 106 or the second transfer chamber 116.

The processing chambers 108A-108G are configured to deposit layers, such as dielectric films, on the substrates to form optical stacks. The processing chambers 108A-108G may deposit optical films having a high optical transparency to form optical stacks. For example, the films may comprise $TiO_2$, $Ta_2O_5$, $Nb_2O_5$, amorphous or poly Si, $SiO_xN_y$, $AlO_xN_y$, ITO, among others. Each film may have a thickness between about 5 nm to 500 nm.

The processing chambers 108A-108G may be any type of processing chambers, for example, chemical vapor deposition (CVD) chambers, atomic layer deposition (ALD) chambers, physical vapor deposition (PVD) chambers, ion metal implant (IMP) chambers, plasma etching chambers, annealing chambers, other furnace chambers, etc. In one implementation, the processing chambers 108A-108G are configured for depositing, annealing, curing and/or etching a flowable dielectric film on a substrate. In one configuration, one or more of the processing chambers 108A-108G may be used to deposit the flowable dielectric material on the substrate. If desired, any of these processing chambers 108A-108G, or one or more additional processing chambers may be coupled to the first and second transfer chambers 106, 116 and arranged to perform other conventional semiconductor device fabrication process such as oxidation, film deposition, etching, heating, degassing, ashing, ion implanting, metrology, etc. upon application.

Following the deposition of a film or layer on the optical stacks, the first and second sets of robotic arms 112, 118 are configured to place the stacks under or above the OBM unit 110 on the first cooling chamber 120 to measure one or more properties of the deposited. The OBM 110 is configured to measure the one or more properties of the deposited layer by shining light on to the deposited layer and collecting the reflected light back from the deposited layer. The OBM 110 may be enclosed in the internal enclosed environment so that the properties of the deposited layers may be measured without breaking or breaching the environment.

In one embodiment, the OBM unit 110 comprises at least one of a reflectometer and an ellipsometer. The OBM unit 110 may comprise a plurality of optical probes. The OBM unit 110 is configured to measure the optical reflectance spectrum of each deposited layer. The OBM unit 110 is further configured to measure a variety of film properties, such as film thickness, optical reflectance spectrum, optical transmittance spectrum, optical absorption spectrum, refractive index, distinction coefficient, composition, wafer bow, and stress, before and/or after processing of the substrate. Various process and hardware engineering knobs (not shown) disposed on the processing tool 100 may be tuned to precisely control the uniformity, density, smoothness, optically transparency, stress, and particle count of each individual layer in response to the results of the OBM unit 110.

The OBM unit 110 is further configured to provide real-time optical response feedback, allowing subsequent layers to compensate for any errors detected in a measured layer. The results from the OBM unit 110 can be further used to develop algorithms for feed-forward thickness correction to ensure optimal optical spectrum performance. For example, if a measured layer is determined to have a non-uniform thickness or other thickness error, subsequently added layers can take the non-uniform thickness of the measured layer into account and compensate for such errors. Thus, the subsequently added layers may correct for thickness errors in previously added layers.

By utilizing an OBM unit 110 to measure each deposited layer, various properties of each layer can be precisely and accurately controlled, such as the individual layer thickness, surface roughness, layer uniformity, optical reflectance spectrum, and other optical properties. Furthermore, since the OBM unit 110 is integrated with the processing tool 100, the internal enclosed environment will not be broken or breached in order to measure the properties of the various layers. As such, the layers will not be exposed to air or other ambient environment, reducing particle issues/contamination and surface/interface deteriorations. Additionally, the OBM unit 110 being disposed within the processing tool 100 allows real time feedback to be obtained while forming the optical stack, improving thickness accuracy and uniformity, and increasing throughput.

Figure 2:
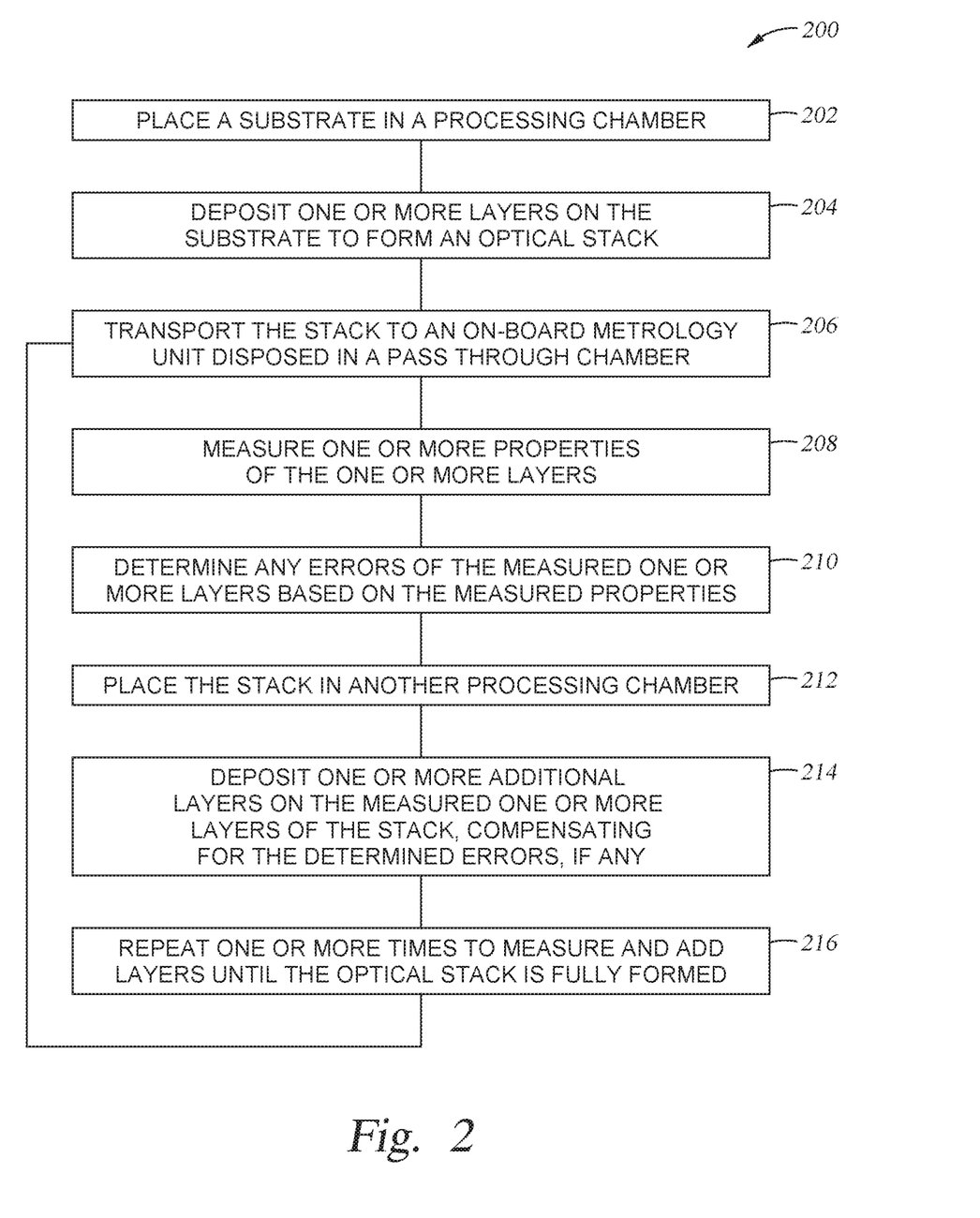
FIG. 2 illustrates a method of forming an optical stack utilizing an on-board metrology unit, according to one embodiment.

FIG. 2 illustrates a method 200 of forming an optical stack having uniform layers, according to one embodiment. Method 200 may be utilized with the processing tool 100 of FIG. 1.

In operation 202, a substrate is placed into a processing chamber of a processing tool. The processing chamber may be any type of processing chamber, for example, a CVD chamber, an ALD chamber, a PVD chamber, an IMP chamber, a plasma etching chamber, an annealing chamber, another furnace chamber, etc.

In operation 204, one or more layers are deposited on the substrate to form an optical stack. The one or more layers may comprise a material having a high optical transparency, such as $TiO_2$, $Ta_2O_5$, $Nb_2O_5$, amorphous or poly Si, $SiO_xN_y$, $AlO_xN_y$, ITO, among others. Each of the one or more layers may have a thickness between about 5-500 nm.

In operation 206, the stack is removed from the processing chamber and transported to an OBM unit disposed in a pass through chamber within the processing tool. Because the OBM unit is disposed within the processing tool, the internal enclosed environment will not be broken or breached when transferring stacks between processing chambers and the OBM unit. Thus, the layers of the stack will not be exposed to air or other ambient environment, reducing particle issues/contamination and surface/interface deteriorations.

In operation 208, one or more properties of the one or more layers of the stack are measured using the OBM unit. The OBM unit is configured to measure the one or more properties of the one or more layers by shining light on to the one or more layer and collecting the reflected light back from the one or more layers. The one or more measured properties may include the thickness, optical reflectance spectrum, optical transmittance spectrum, optical absorption spectrum, refractive index, distinction coefficient, composition, wafer bow, and stress.

In operation 210, any errors of the measured one or more layers are determined based on the measured properties for correction of subsequent layers. The errors are determined in real-time, allowing subsequent layer(s) to compensate for any errors detected in the one or more measured layers. The errors may be used to develop algorithms for feed-forward thickness correction to ensure optimal optical spectrum performance.

In operation 212, the stack is removed from the OBM unit and placed in another processing chamber in the processing tool. The processing chamber may be the same chamber used in operation 202, or the processing chamber may be a different chamber within the processing tool. The processing chamber may be any type of processing chamber, for example, a CVD chamber, an ALD chamber, a PVD chamber, an IMP chamber, a plasma etching chamber, an annealing chamber, another furnace chamber, etc.

In operation 214, one or more layers are deposited on the measured one or more layers of the stack, compensating for the errors determined in operation 210, if any. In one embodiment, the material of the one or more layers deposited has a different refractive index than the material of the measured one or more layers. The one or more layers may comprise a material having a high optical transparency, such as $TiO_2$, $Ta_2O_5$, $Nb_2O_5$, amorphous or poly Si, $SiO_xN_y$, $AlO_xN_y$, ITO, among others. Each of the one or more layers may have a thickness between about 5-500 nm.

In operation 216, operations 206-214 are repeated one or more times to measure and add layers until the optical stack is fully formed. Each time one or more layers are added to the stack, the stack is placed in the OBM unit to measure one or more properties of the added layers. Any errors of the measured layers are then determined based on the measured properties for correction in subsequent layers. The stack is then placed in another deposition chamber (or the prior deposition chamber), and one or more layers are again added on to the measured layers, compensating for any previously determined errors. Thus, the processing tool continuously measures the properties of the layers of the stack, determines any errors of the layers, and adds additional layers to the stack, compensating for any errors. When repeating operations 206-214, operations 206-210 are optional and may be skipped. As such, additional layers may be added to the stack without being measured by the OBM unit each time. Once the optical stack is fully formed, method 200 ends and the optical stack is removed from the processing tool.

Figure 3A:
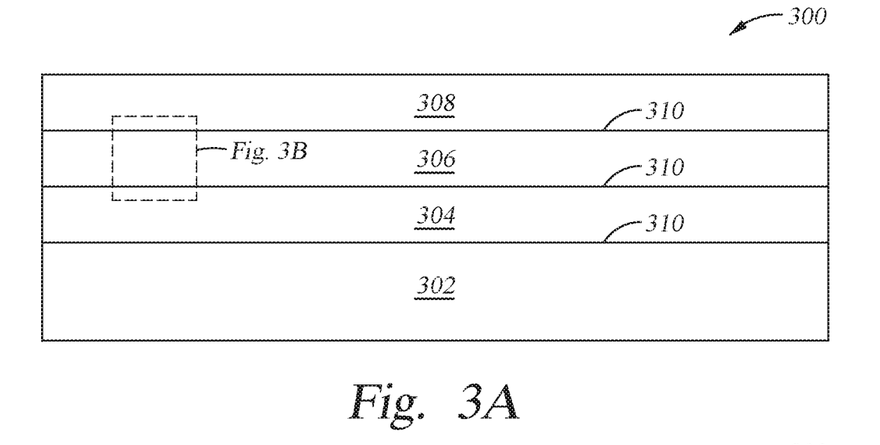
FIGS. 3A-3B illustrate various views of an optical stack formed utilizing external metrology, according to one embodiment.
Figure 3B:
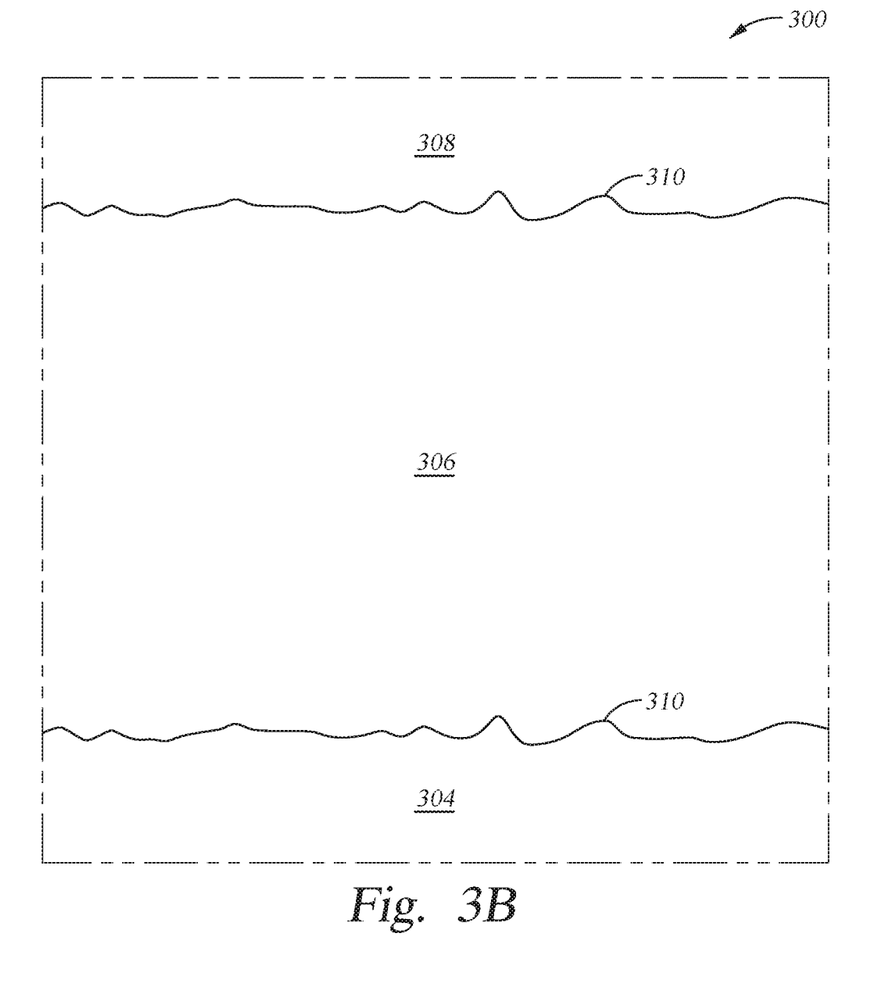

FIGS. 3A-3B illustrate various views of an optical stack 300 formed utilizing an external metrology assembly, according to one embodiment. To form the optical stack 300 of FIGS. 3A-3B, a first layer 304 was deposited on a substrate 302, and the stack 300 was removed from the processing tool to measure the properties of the first layer 304 using an external metrology assembly. After measuring the first layer 304, the stack 300 re-entered the internal environment of the processing tool, and a second layer 306 was deposited on the first layer 304. The stack 300 was then removed from the processing tool to measure the properties of the second layer 306 using the external metrology assembly. After measuring the second layer 306, the stack 300 re-entered the internal environment of the processing tool, and a third layer 308 was deposited on the second layer 306. The stack 300 was then removed from the processing tool to measure the properties of the third layer 308 using the external metrology assembly. Each time one of the layers 304, 306, 308 was measured, the internal environment was broken or breached, and the layer 304, 306, 308 was exposed to air or other ambient environment.

FIG. 3A illustrates a non-magnified view of an optical stack 300 formed using external metrology. The first layer 304, the second layer 306, and the third layer 308 may all comprise different materials, or the second layer 306 may comprise a different material than the first layer 304 and the third layer 308. As shown in FIG. 3A, the interfaces 310 between each layer 304, 306, 308 appear to be straight, indicating that the layers 304, 306, 308 are uniformly deposited.

FIG. 3B illustrates a magnified or zoomed in view of a portion of the stack 300 within the box labeled 3B in FIG. 3A. The magnified view of the stack 300 shows a portion of the first layer 304, a portion of the third layer 308, and the second layer 306. As shown in FIG. 3B, the interfaces 310 between the layers 304, 306, 308 are uneven and are not straight, indicating that the layers 304, 306, 308 were not actually uniformly deposited or have rough surfaces. The non-uniformity and roughness of the interfaces 310 may be a result of being exposed to air or other ambient environment when measured using the external metrology assembly. Exposing the layers 304, 306, 308 of the stack 300 to air may result in contamination or deterioration of the layers 304, 306, 308 or interfaces 310, which in turn causes the interfaces 310 to become uneven or non-uniform.

Figure 4A:
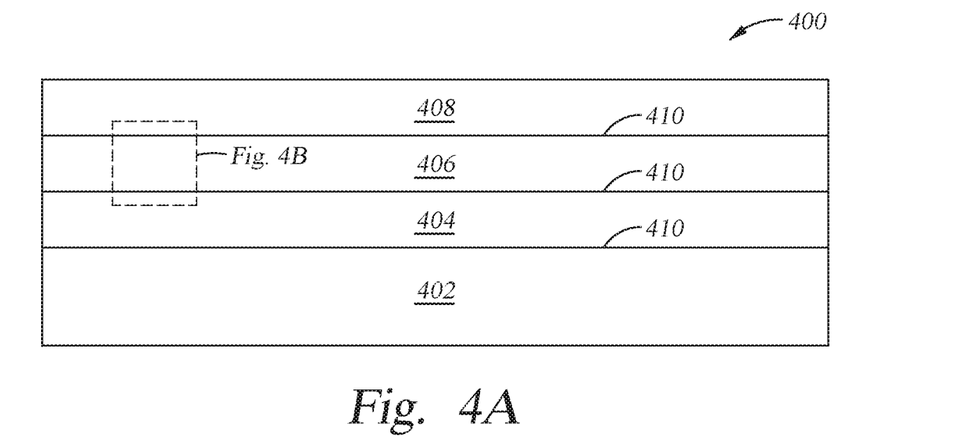
FIGS. 4A-4B illustrate various views of an optical stack formed utilizing an on-board metrology unit, according to another embodiment.
Figure 4B:
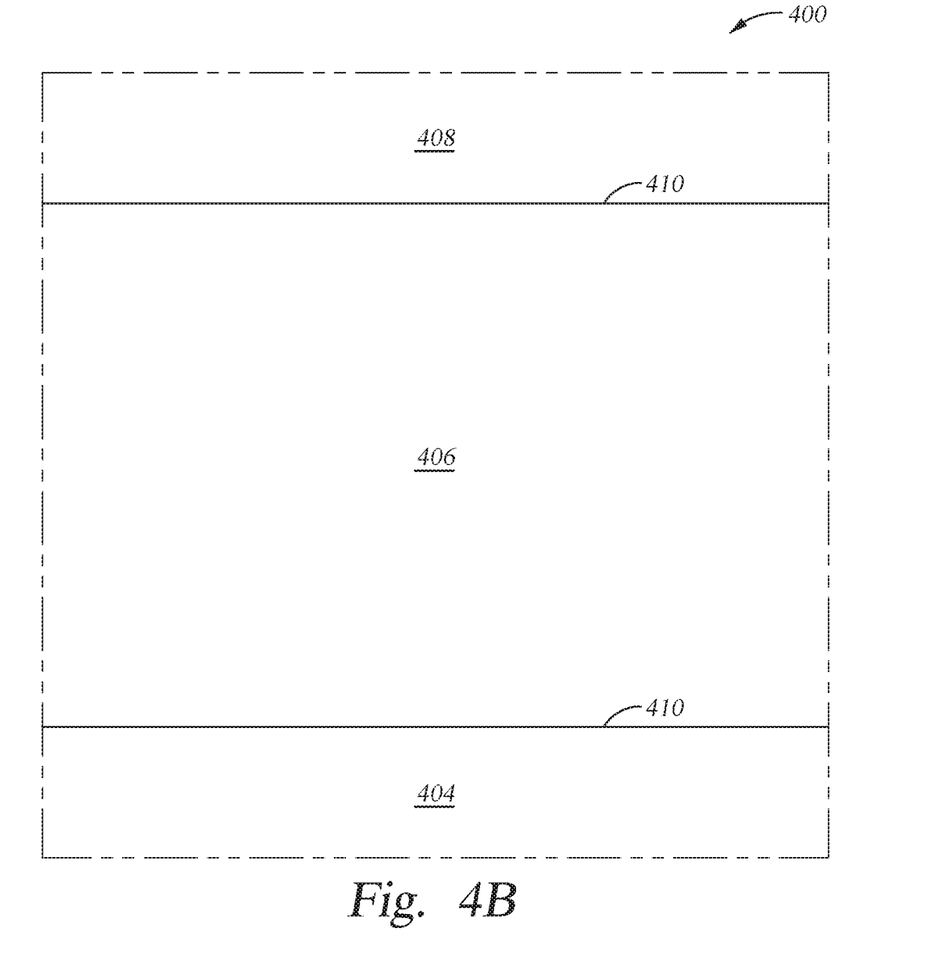

FIGS. 4A-4B illustrate various views of an optical stack 400 formed utilizing an OBM unit, according to one embodiment. The processing tool 100 having the OBM unit 110 may be used to form the stack 400. To form the optical stack 400 of FIGS. 4A-4B, a first layer 404 was deposited on a substrate 402, and the stack 400 was moved to the OBM unit within the processing tool to measure the properties of the first layer 404. After measuring the first layer 404, any errors of the first layer 404 were determined, and a second layer 406 was deposited on the first layer 404, compensating for the determined errors. The stack 400 was then moved to the OBM unit within the processing tool to measure the properties of the second layer 406. After measuring the second layer 406, any errors of the second layer 406 were determined, and a third layer 408 was deposited on the first layer 404, compensating for the determined errors. The stack 400 was then moved to the OBM unit within the processing tool to measure the properties of the third layer 408. After measuring the third layer 408, any errors of the third layer 408 were determined. Each time one of the layers 404, 406, 408 was measured, the stack 400 remained within the internal enclosed environment of the processing tool, and the stack 400 was not exposed to air.

FIG. 4A illustrates a non-magnified view of an optical stack 400 formed utilizing an OBM unit. The first layer 404, the second layer 406, and the third layer 408 may all comprise different materials, or the second layer 406 may comprise a different material than the first layer 404 and the third layer 408. As shown in FIG. 4A, the interfaces 410 between each layer 404, 406, 408 appear to be straight, indicating that the layers 404, 406, 408 are uniformly deposited and have smooth, flat surfaces.

FIG. 4B illustrates a magnified or zoomed in view of a portion of the stack 400 within the box labeled 4B in FIG. 4A. The level of magnification of FIG. 4B is the same as FIG. 3B. The magnified view of the stack 400 shows a portion of the first layer 404, a portion of the third layer 408, and the second layer 406. As shown in FIG. 4B, the interfaces 410 between the layers 404, 406, 408 are straight with little to no unevenness, indicating that the layers 404, 406, 408 were uniformly deposited. Utilizing the OBM unit within the processing tool prevents the stack 400 from being exposed to air or other ambient environment, which in turn prevents deterioration or contamination that may result in the of the layers 404, 406, 408 and/or interfaces 410 being uneven.

By utilizing an OBM unit within the processing to measure each deposited layer, various properties of each layer can be precisely and accurately controlled, such as the individual layer thickness, surface roughness, layer uniformity, optical reflectance spectrum, and other optical properties. Furthermore, since the OBM unit is disposed within the processing tool, the internal enclosed environment will not be broken or breached in order to measure the properties of the various layers. As such, the layers will not be exposed to air or other ambient environment, reducing particle issues/contamination and surface/interface deteriorations. Additionally, the OBM unit being disposed within the processing tool allows real time feedback to be obtained while forming the optical stack, improving thickness accuracy and uniformity, and increasing throughput.

In one embodiment, a processing tool comprises, a first transfer chamber, a second transfer chamber coupled to the first transfer chamber, one or more processing chambers coupled to the first transfer chamber or the second transfer chamber, and an on-board metrology unit disposed between the first transfer chamber and the second transfer chamber. The first transfer chamber, the second transfer chamber, and the on-board metrology unit are disposed in an enclosed environment.

The on-board metrology unit may comprise a reflectometer. The on-board metrology unit may comprise an ellipsometer. The on-board metrology unit may be configured to measure one or more optical properties of one or more layers of an optical stack. The one or more optical properties may be selected from the group consisting of thickness, optical reflectance spectrum, optical transmittance spectrum, optical absorption spectrum, refractive index, distinction coefficient, composition, wafer bow, and stress. At least one processing chamber of the one or more processing chambers coupled to the first transfer chamber or the second transfer chamber may be a physical vapor deposition chamber. At least one processing chamber of the one or more processing chambers coupled to the first transfer chamber or the second transfer chamber may be a chemical vapor deposition chamber.

In another embodiment, a method of forming an optical stack comprises depositing a first layer on a substrate in a first processing chamber, measuring one or more properties of the first layer using an on-board metrology unit, determining one or more errors of the first layer for correction in subsequent layers, and depositing a second layer on the first layer in a second processing chamber. The method further comprises measuring one or more properties of the second layer using the on-board metrology unit. The first processing chamber, the second processing chamber, and the on-board metrology unit are disposed in enclosed environment.

The on-board metrology unit may comprise one or more of a reflectometer and an ellipsometer. The one or more optical properties may be selected from the group consisting of thickness, optical reflectance spectrum, optical transmittance spectrum, optical absorption spectrum, refractive index, distinction coefficient, composition, wafer bow, and stress. The material of the first layer may have a different refractive index than the material of the second layer. The method may further comprise depositing one or more additional layers on the second layer in the first processing chamber or the second processing chamber. Each time an additional layer is deposited, one or more properties of the additional layer may be measured using the on-board metrology unit and one or more errors of the additional layer may be determined for correction in subsequent additional layers.

In yet another embodiment, a processing tool comprises a factory interface coupled to one or more front opening unified pods and a first transfer chamber coupled to the factory interface. The first transfer chamber comprises a first set of robotic arms. The processing tool further comprises a second transfer chamber coupled to the first transfer chamber. The second transfer chamber comprises a second set of robotic arms. The processing tool further comprises a plurality of chambers coupled to the first transfer chamber or the second transfer chamber. The plurality of chambers comprises a first plurality of processing chambers and a plurality of support chambers. The processing tool further comprises an on-board metrology unit disposed between the first transfer chamber and the second transfer chamber. The first transfer chamber, the second transfer chamber, and the on-board metrology unit are disposed in a vacuum environment.

The on-board metrology unit may comprise a reflectometer. The on-board metrology unit may comprise an ellipsometer. The on-board metrology unit may be configured to measure one or more optical properties of one or more layers of an optical stack. The one or more optical properties may be selected from the group consisting of thickness, optical reflectance spectrum, optical transmittance spectrum, optical absorption spectrum, refractive index, distinction coefficient, composition, wafer bow, and stress. At least one processing chamber of the first plurality of processing chambers or the second plurality of processing chambers may be a physical vapor deposition chamber. At least one processing chamber of the first plurality of processing chambers or the second plurality of processing chambers may be a chemical vapor deposition chamber.

While the foregoing is directed to embodiments of the present disclosure, other and further embodiments of the disclosure may be devised without departing from the basic scope thereof, and the scope thereof is determined by the claims that follow.

What is claimed is:

1. A processing tool, comprising:
a first transfer chamber;
a second transfer chamber coupled to the first transfer chamber, wherein one or more processing chambers are coupled to the first transfer chamber or the second transfer chamber; and
an on-board metrology unit disposed between the first transfer chamber and the second transfer chamber, wherein the first transfer chamber, the second transfer chamber, and the on-board metrology unit are disposed in an enclosed environment, wherein the on-board metrology unit is configured to:
measure one or more optical properties of one or more layers of an optical stack;
determine any errors of the one or more layers based on the one or more measured optical properties; and
provide real-time optical response feedback to the processing tool, wherein the processing tool is configured to tune at least one of a process engineering knob and a hardware engineering knob disposed on the processing tool based on the feedback from the on-board metrology unit to compensate for the errors detected in a measured layer in subsequently deposited layers.

2. The processing tool of claim 1, wherein the on-board metrology unit comprises a reflectometer.

3. The processing tool of claim 1, wherein the on-board metrology unit comprises an ellipsometer.

4. The processing tool of claim 1, wherein the one or more optical properties are selected from the group consisting of thickness, optical reflectance spectrum, optical transmittance spectrum, optical absorption spectrum, refractive index, distinction coefficient, composition, wafer bow, and stress.

5. The processing tool of claim 1, wherein at least one processing chamber of the one or more processing chambers coupled to the first transfer chamber or the second transfer chamber is a physical vapor deposition chamber.

6. The processing tool of claim 1, wherein at least one processing chamber of the one or more processing chambers coupled to the first transfer chamber or the second transfer chamber is a chemical vapor deposition chamber.

7. A method of forming an optical stack, comprising:
depositing a first layer on a substrate in a first processing chamber;
measuring one or more properties of the first layer using an on-board metrology unit, wherein the on-board metrology unit is configured to provide feedback to a processing tool;
determining one or more errors of the first layer for correction in subsequent layers;
tuning at least one of a process engineering knob and a hardware engineering knob disposed on the processing tool to compensate for the errors detected in the first layer based on the feedback from the on-board metrology unit;
depositing a second layer on the first layer in a second processing chamber; and
measuring one or more properties of the second layer using the on-board metrology unit, wherein the first processing chamber, the second processing chamber, and the on-board metrology unit are disposed in enclosed environment.

8. The method of claim 7, wherein the on-board metrology unit comprises one or more of a reflectometer and an ellipsometer.

9. The method of claim 7, wherein the one or more properties are selected from the group consisting of thickness, optical reflectance spectrum, optical transmittance spectrum, optical absorption spectrum, refractive index, distinction coefficient, composition, wafer bow, and stress.

10. The method of claim 7, wherein material of the first layer has a different refractive index than material of the second layer.

11. The method of claim 7, further comprising:
depositing one or more additional layers on the second layer in the first processing chamber or the second processing chamber,
wherein each time an additional layer is deposited, one or more properties of the additional layer are measured using the on-board metrology unit and one or more errors of the additional layer are determined for correction in subsequent additional layers.

12. The method of claim 7, further comprising:
determining one or more errors of the second layer for correction in subsequent layers;
depositing a third layer on the second layer in a third processing chamber; and
measuring one or more properties of the third layer using the on-board metrology unit.

13. A processing tool, comprising:
a factory interface coupled to one or more front opening unified pods;
a first transfer chamber coupled to the factory interface, the first transfer chamber comprising a first set of robotic arms;
a second transfer chamber coupled to the first transfer chamber, the second transfer chamber comprising a second set of robotic arms;
a plurality of chambers coupled to the first transfer chamber or the second transfer chamber, the plurality of chambers comprising a first plurality of processing chambers and a plurality of support chambers;
an on-board metrology unit disposed between the first transfer chamber and the second transfer chamber, wherein the first transfer chamber, the second transfer chamber, and the on-board metrology unit are disposed in a vacuum environment, wherein the on-board metrology unit is configured to:

measure one or more optical properties of one or more layers of an optical stack;

determine any errors of the one or more layers based on the one or more measured optical properties; and provide real-time optical response feedback to the processing tool based on the one or more measured optical properties, wherein the processing tool is configured to tune at least one of a process engineering knob and a hardware engineering knob disposed on the processing tool based on the feedback from the on-board metrology unit to compensate for the errors detected in a measured layer in subsequently deposited layers.

14. The processing tool of claim 13, wherein the on-board metrology unit comprises a reflectometer.

15. The processing tool of claim 13, wherein the on-board metrology unit comprises an ellipsometer.

16. The processing tool of claim 13, wherein the one or more optical properties are selected from the group consisting of thickness, optical reflectance spectrum, optical transmittance spectrum, optical absorption spectrum, refractive index, distinction coefficient, composition, wafer bow, and stress.

17. The processing tool of claim 13, wherein at least one processing chamber of the first plurality of processing chambers is a physical vapor deposition chamber.

18. The processing tool of claim 13, wherein at least one processing chamber of the first plurality of processing chambers is a chemical vapor deposition chamber.

19. The processing tool of claim 1, wherein at least one of the process engineering knob and the hardware engineering knob is tuned to control one or more film properties from the group consisting of uniformity, density, smoothness, optically transparency, stress, and particle count.

20. The processing tool of claim 13, wherein at least one of the process engineering knob and the hardware engineering knob is tuned to control one or more film properties from the group consisting of uniformity, density, smoothness, optically transparency, stress, and particle count.

* * * * *